United States Patent
Gardner et al.

(12)

(10) Patent No.: US 6,225,168 B1
(45) Date of Patent: May 1, 2001

(54) SEMICONDUCTOR DEVICE HAVING METAL GATE ELECTRODE AND TITANIUM OR TANTALUM NITRIDE GATE DIELECTRIC BARRIER LAYER AND PROCESS OF FABRICATION THEREOF

(75) Inventors: Mark I. Gardner, Cedar Creek; H. Jim Fulford, Austin; Charles E. May, Austin; Fred Hause, Austin; Dim-Lee Kwong, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/090,792

(22) Filed: Jun. 4, 1998

(51) Int. Cl.[7] .......................... H01L 21/336; H01L 21/76
(52) U.S. Cl. ...................... 438/287; 438/412; 438/413; 438/592

(58) Field of Search ..................................... 438/287, 412, 438/413, 592

(56) References Cited

U.S. PATENT DOCUMENTS

| 5,861,676 | * | 1/1999 | Yen ....................................... 257/776 |
| 6,004,850 | * | 2/1999 | Lucas et al. ......................... 438/301 |
| 6,020,024 | * | 2/2000 | Maiti et al. ....................... 427/248.1 |

* cited by examiner

*Primary Examiner*—John F. Niebling
*Assistant Examiner*—Alexander G. Ghyka

(57) ABSTRACT

Semiconductor devices having a metal gate electrode and a titanium or tantalum nitride gate dielectric barrier layer and processes for fabricating such devices are provided. The use of a metal gate electrode along with a titanium or tantalum nitride gate dielectric barrier layer can, for example, provide a highly reliable semiconductor device having an increased operating speed as compared to conventional transistors.

20 Claims, 3 Drawing Sheets

SEMICONDUCTOR DEVICE HAVING METAL GATE ELECTRODE AND TITANIUM OR TANTALUM NITRIDE GATE DIELECTRIC BARRIER LAYER AND PROCESS OF FABRICATION THEREOF

FIELD OF THE INVENTION

The present invention is generally directed to semiconductor devices and, more particularly, to semiconductor devices having a metal gate electrode and a titanium or tantalum nitride gate dielectric barrier layer.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. Device performance can be further improved by increasing the operating speeds and reliability of the transistors on a device. Accordingly, improvements to transistor structures (e.g., source and drains, gate electrode, gate insulating layer) are continually sought in order to increase the operating speeds and reliability of the transistors.

SUMMARY OF THE INVENTION

The present invention provides semiconductor devices having a metal gate electrode and a titanium or tantalum nitride gate dielectric barrier layer and processes for fabricating such devices. The use of a metal gate electrode along with a titanium or tantalum nitride gate dielectric barrier layer can, for example, provide a highly reliable semiconductor device having an increased operating speed as compared to conventional transistors.

A process of fabricating a semiconductor device, consistent with one embodiment of the invention, includes forming a gate dielectric layer over a substrate; forming a titanium or tantalum nitride barrier layer over the gate dielectric layer; and forming a metal gate electrode over the titanium or tantalum nitride barrier layer. The nitride barrier layer may, for example, have a thickness which is sufficiently thick to inhibit interaction between the metal gate electrode and the gate dielectric layer. The process may further include forming nitrogen bearing spacers adjacent sidewalls of the metal gate electrode such that the spacers and the barrier layer seal the gate dielectric layer against the substrate.

A semiconductor device, in accordance with an embodiment, includes a substrate, a gate dielectric layer disposed over the substrate, a titanium or tantalum nitride barrier layer disposed over the gate dielectric layer, and a metal gate electrode disposed over the Ta/Ti nitride barrier layer. The semiconductor device may further include nitrogen bearing spacers adjacent the gate electrode.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description in connection with the accompanying drawings, in which.

Figure 1:
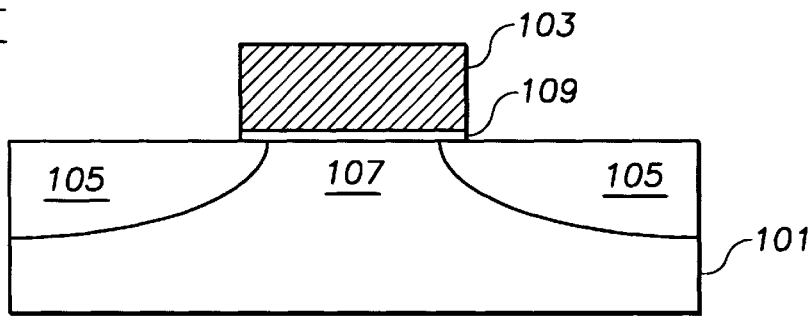
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention generally relates to semiconductor devices including, for example, MOS, CMOS, and Bi-CMOS devices, which may benefit from metal gate electrodes. While the present invention is not so limited, details of the present invention will be illustrated through the discussion which follows.

Figure 2A:
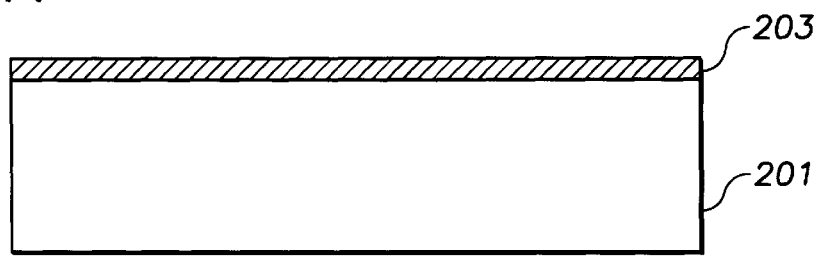
FIGS. 2A, 2B, 2C, and 2D illustrate an exemplary process in accordance with one embodiment of the invention

FIGS. 2A–2E illustrate an exemplary process for forming a semiconductor device having a metal gate electrode and a titanium nitride or tantalum nitride barrier layer. In accordance with this embodiment, a layer 203 of tantalum or titanium (hereinafter Ta/Ti) is formed over a substrate 201, as illustrated in FIG. 2A. The substrate 201 is typically a silicon substrate. The Ta/Ti layer 203 may be formed using, for example, well-known sputter deposition or metal-organic chemical vapor deposition (MOCVD) techniques.

The Ta/Ti layer 203 will be used to form a Ta or Ti-bearing gate dielectric layer (e.g., a $Ta_2O_5$ or $TiO_2$ layer) as well as a tantalum nitride (TaN) or titanium nitride (TiN) barrier layer separating the gate dielectric layer from a gate electrode. The thickness of the Ta/Ti layer 203 is suitably selected in consideration of the desired thicknesses of the gate dielectric and barrier layers. The thicknesses of the gate dielectric and barrier layers depend, in turn, on the desired capacitive properties of the gate dielectric and the necessary barrier properties of the barrier layer. Suitable thicknesses of the Ta/Ti layer 203 range from about 25 to 600 angstroms (Å) for many applications. Suitable thicknesses for a $TiO_2$ or $Ta_2O_5$ gate dielectric layer range from about 15–400 Å for many applications. Suitable thicknesses for a TaN/TiN barrier layer range from about 50 to 500 Å for many applications.

Using the Ta/Ti layer 203, a gate dielectric layer 205 and a tantalum nitride or titanium nitride (TaN/TiN) barrier layer 209 are formed. This is typically done by oxidizing and nitriding the Ta/Ti layer 203. The oxidation and nitridation may be performed by annealing the substrate 201 in a controlled ambient. The characteristics of the anneal and the ambient are typically selected in consideration of the desired thicknesses of the resulting gate dielectric and barrier layers 205 and 209, taking into account the presence of native oxide, if any, which may have formed on the surface of the substrate 201 prior to forming the Ta/Ti layer 203.

In the illustrated embodiment, the gate dielectric layer 205 is first formed by annealing the substrate 201 in an ambient containing from 0 to about 10% oxygen by weight, with the remaining portion made up of inert gases, such as helium or argon. Nitrogen may also be used if the oxidation rate is desired to be slower. The oxidation anneal may, for example, be performed at 700 to 800 degrees for 30 to 60 seconds. The particular concentration of oxygen can vary depending on the amount of native oxide. With enough native oxide (e.g., 3–8 Å) to form the gate dielectric layer 205 with the desired thickness, the percentage of oxygen may be so little as 0%. The oxidation generally forms the gate dielectric layer 205. As should be appreciated, the gate dielectric layer 205 will be a tantalum oxide (e.g., $Ta_2O_5$) or a titanium oxide (e.g., $TiO_2$) depending on whether titanium or tantalum is used for the Ta/Ti layer 203.

Both tantalum oxide and titanium oxide have a higher permittivity (i.e., dielectric constant, k) than the silicon dioxide normally used to form the gate dielectric layers of conventional transistors. For example, the permittivity of $TiO_2$ is about 80–90 and the permittivity of $Ta_2O_5$ is about 25, while silicon dioxide has a permittivity of about 4. Accordingly, using 100 to 400 Å of $Ta_2O_5$ provides a gate dielectric layer 205 having an equivalent thickness of about 15 to 70 Å of silicon dioxide (i.e., 100–400 Å of the $Ta_2O_5$ has the equivalent capacitive characteristics as about 15 to 70 Å of silicon dioxide). Similarly, 100 to 400 Å of $TiO_2$ provides a gate dielectric layer 205 (assuming a dielectric constant of 85) having an equivalent silicon dioxide thickness of about 5 to 20 Å.

Figure 2B:
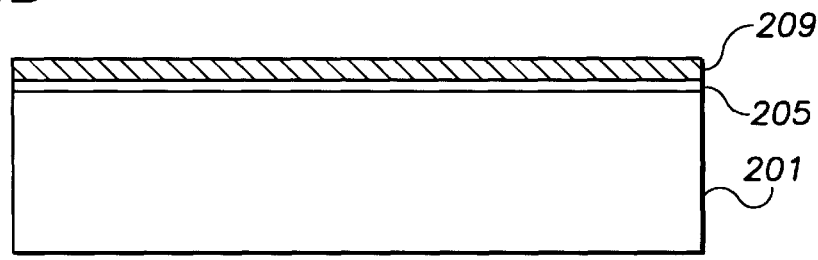

Following oxidation, the substrate may be annealed in an ambient including one or more nitrogen bearing species (e.g., N, $N_2$, NO, etc.). The nitridation and oxidation anneals may advantageously be performed in a common anneal chamber by selectively controlling the flow of oxygen and nitrogen. The nitridation process may be performed, for example, by annealing the substrate 201 at 800 to 900 degrees Celsius for 30 to 60 seconds in an ambient containing 2 to 50% nitrogen by weight. The reminder of the ambient may consist of inert gases and oxygen, if desired. The nitridation anneal generally forms a titanium nitride or tantalum nitride gate barrier layer 209 (hereinafter TiN/TaN layer 209) depending on the type of metal used to form Ti/Ta layer 203. The resultant structure is illustrated in FIG. 2B.

While the formation of the gate dielectric layer 205 and TaN/TiN barrier layer 209 using a single Ta/Ti layer 205 is described as being discrete, the invention is not so limited. The gate dielectric and barrier layers may, e.g., be formed simultaneously by oxidation and nitridation in a nitrogen and oxygen bearing ambient (with or without native oxide) or in a nitrogen bearing ambient with some native oxide. In either case, the oxidation and nitridation of a Ta/Ti layer provides a highly controllable manner by which to form Ta/Ti-bearing gate dielectric and barrier layers.

A layer of metal 211 is formed over the TaN/TiN barrier layer 209. The metal layer 211 may be formed from a number of different metals using a number of different techniques. The metal layer may, for example, be formed from tungsten using MOCVD or sputter deposition techniques. The thickness of the layer of metal 211 is suitably selected in consideration of the desired thickness of the gate electrode. Suitable thicknesses for a gate electrode range from about 1000 to 3000 Å for many applications.

Portions of the layer of metal 211 and underlying gate dielectric and barrier layers 205 and 209 are removed to form one or more gate electrode structures 213. The gate electrode structure 213 generally includes a gate electrode 215 formed from the metal 211, a Ti or Ta-bearing gate dielectric layer 205, and a TaN or TiN barrier layer 209, which insulates the gate electrode and the gate dielectric layer 205. Removal of portions of the layer of metal 211 and underlying gate dielectric and barrier layers 205 and 209 may be done using, for example, well-known photolithography and etching techniques.

Figure 2C:
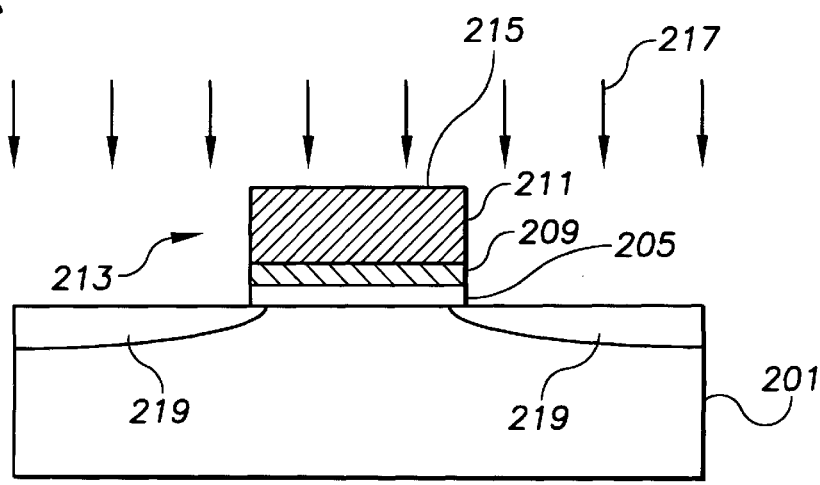
Figure 2D:
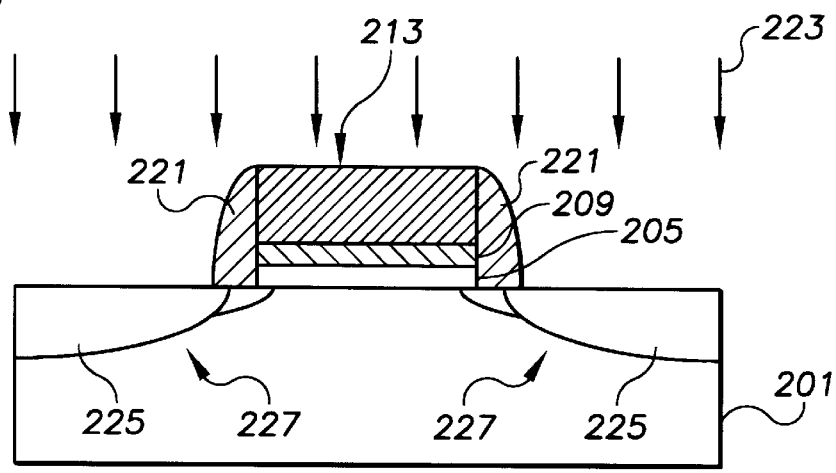

After forming the gate electrode structure 213, source/drain regions are formed in regions of the substrate 201 adjacent the gate electrode structure 213. The formation of lightly-doped drain (LDD) source/drain structures 227 (see FIG. 2D) is illustrated by way of example. To form the LDD structures 227, a low dose of a dopant 217 is implanted into the substrate 201 using the gate electrode structure 213 for alignment. This implant is used to form lightly-doped regions 219. The type of dopant (e.g., p-type or n-type) typically depends on the type of device being formed (e.g., NMOS or PMOS). Suitable n-type dopants include arsenic and phosphorous, while suitable p-type dopants include boron, for example. The resultant structure is shown in FIG. 2C.

Following the LDD implant, spacers 221 are formed on sidewalls of the gate electrode structure 213. The spacers 221 may be formed using a number of different materials, including in particular nitrogen-bearing materials such as nitrides. Nitrogen bearing spacers 221 advantageously serve as diffusion barriers for the metal gate electrode. With other types of spacers, such as silicon dioxide spacers, the metal of the gate electrode may diffuse into and through the spacers and deleteriously impact device performance. In the extreme, the diffused metal could short the gate electrode to an adjacent source/drain region. The use of nitrogen bearing spacers 221 along with the nitride barrier layer 209 also advantageously seals the gate dielectric layer 205 against the substrate 201. This can, e.g., prevent oxidation of the gate dielectric during subsequent heat treatment.

Using the spacers 221 for alignment, a source/drain implant of a dopant 223 (of a similar type as dopant 217) is performed to form heavily-doped regions 225 in the substrate 201. Together the heavily-doped regions 225 and lightly-doped regions 219 form the LDD structures 227. As noted above, the formation of LDD structures is provide by way of example only. In other embodiments, for example, the LDD implant may be omitted with the source/drain regions being formed by the heavier S/D implant using spacers (e.g., nitride spacers) for spacing. Fabrication may continue with conventional processing steps including, for example, silicidation, interconnect formation and so forth to form the ultimate device structure.

Using the above process, a metal gate electrode can be formed with a TiN or TaN barrier layer. This provides a highly reliable device with enhanced performance. The use of a metal gate electrode enhances device performance by, for example, increasing the conductivity of the gate electrode as compared to conventional gate electrodes. By using metal as the gate electrode, the possibility of the formation of a depletion layer at the gate electrode/gate insulating layer interface is also avoided. The TiN/TaN barrier layer, meanwhile, improves device reliability by for example, inhibiting interaction between the metal gate electrode and the gate dielectric layer and inhibiting oxidation of the metal gate electrode or diffusion of metal into and/or through the gate dielectric layer. The use of a nitrogen bearing spacers further seals the metal gate electrode from surrounding dielectric layers and can work in combination with the barrier layer to seal the gate dielectric layer against the substrate and prevent oxidation of gate dielectric layer. Moreover, the use of a tantalum or titanium oxide gate dielectric allows the equivalent thickness of the gate dielectric to be reduced as compared to conventional gate dielectrics utilizing silicon dioxide.

FIGS. 3A–3F illustrate an exemplary process for forming a metal gate electrode with a TiN or TaN gate dielectric barrier layer using a sacrificial plug. The use of a sacrificial plug allows for the formation of gate electrodes using temperature-sensitive metals as more fill described in copending and commonly-assigned patent application entitled "Semiconductor Device Fabrication Using A Sacrificial Plug For Defining A Region For A Gate Electrode," Ser. No. 08/993,612 now U.S. Pat. No. 6,051,487. In accordance with this exemplary process, an insulating layer 303 is formed over a substrate 301. The insulating layer 303 may be formed, for example, from an oxide such as $SiO_2$ using, for example, well-known deposition or growth techniques. Suitable thicknesses for the insulating layer range from about 25–100 Å for many applications. One or more sacrificial plugs 305 (only one of which is shown) are formed over the insulating layer 303. The sacrificial plug 305 is typically formed from a material which is selectively removable with respect to a later-formed film 307 (see FIG. 3B). Suitable materials for the sacrificial plug 305 include polysilicon, nitrogen-bearing materials such as nitrides, or even some relatively temperature insensitive metals, such as cobalt. The sacrificial plug 305 may be formed, for example, by forming a layer using well-known deposition techniques, and removing a part of the layer to form the sacrificial plug 305 using well-known masking and etching techniques.

The sacrificial plug 305 will be used to define a region for a gate electrode on the substrate 301. The thickness and width of the sacrificial plug 305 are typically chosen in consideration of the desired thickness and width of the gate electrode. Suitable thicknesses and widths of the sacrificial plug 305 range from about 1000 to 3000 Å, and about 0.1 to 0.25 microns, respectively, for many applications.

Figure 3A:
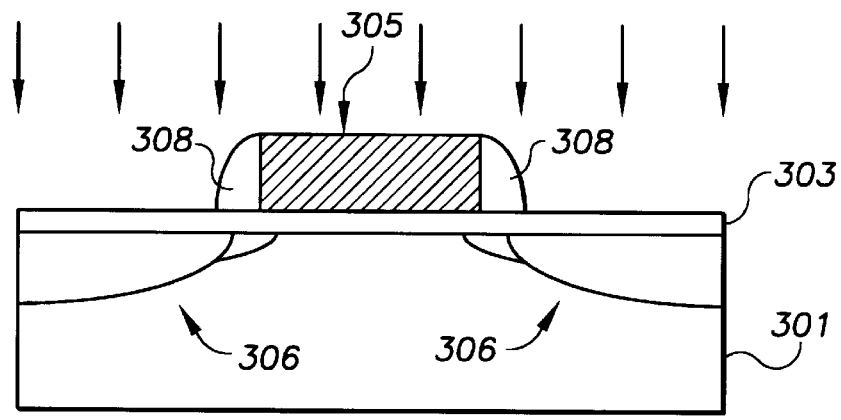
FIGS. 3A, 3B, 3C, 3D, and 3E illustrate an exemplary process in accordance with another embodiment of the invention.

Active regions 306 are formed in portions of the substrate 301 adjacent the sacrificial plug 305. The active regions 306 may, for example, be source/drain regions, including LDD (lightly-doped-drain) source/drain regions. An LDD source/drain region may be formed by making two implants in the substrate 301. Typically, the first implant is a light dose of a dopant material (e.g., arsenic, phosphorous, or boron), and the second implant is a heavier dose, deeper implant of a similar-type or the same dopant material. The first dose is typically implanted into the substrate 301 using the sacrificial plug 305 for alignment. Spacers 308 (e.g., oxide spacers) are then formed on sidewalls of the sacrificial plug 305. The spacers 308 are used to space the a second dopant implant from the sacrificial plug 305. The dopant implants, as well as spacer formation, may be done using well-known techniques. After forming the active regions 306, the substrate 301 may be heated to activate the dopants in the active regions 306 and to drive the dopants deeper into the substrate 301. The substrate 301 may be heated using, e.g., well-known anneal techniques such as rapid thermal anneal (RTA). The resultant structure is illustrated in FIG. 3A.

Figure 3B:
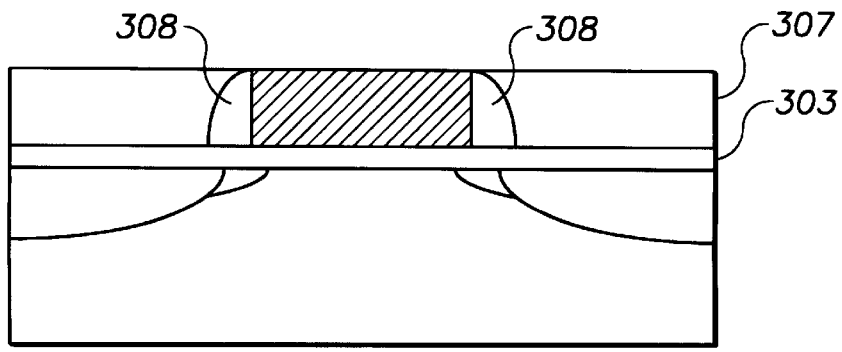

A film 307 is formed over the substrate 301 and adjacent the sacrificial plug 305 using, for example, well-known deposition techniques. The resultant structure is depicted in FIG. 3B. The film 307 may be deposited to a thickness greater than that of the sacrificial plug 305 and then planarized to obtain substantially the same thickness as sacrificial plug 305. The film 307 may be planarized using, for example, well-known chemical-mechanical polishing techniques. The material of film 307 is chosen so that the sacrificial plug 305 may be selectively removed with respect to film 307. For example, film 307 may be formed from an oxide when sacrificial plug 305 is formed from a material such as nitride, metal, or polysilicon, which is selectively removable with respect to oxide. While the film 307, spacers 308, and insulating layer 303 are shown separately, these feature will blend together when formed of the same material. For ease of illustration, these features are assumed to blend and will collectively be referred to hereinafter as the film 207.

Figure 3C:
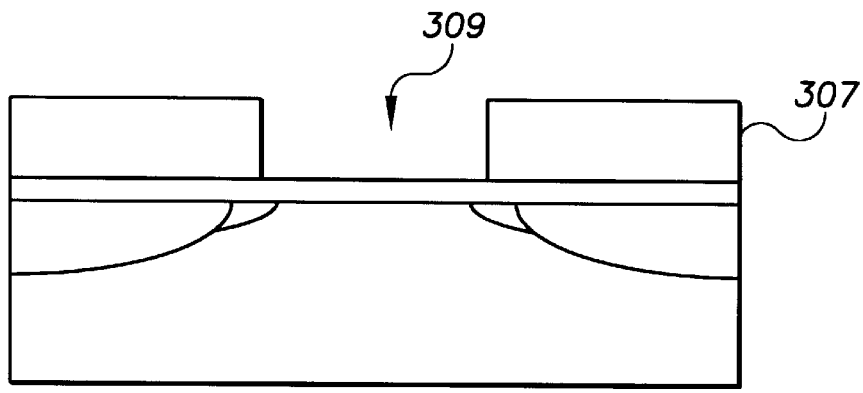

The sacrificial plug 305 is selectively removed, leaving an opening 309 in film 307. The sacrificial plug 305 may be removed, for example, by using etching techniques, such as plasma etching or caros stripping, which selectively etch the sacrificial plug 305 and leave the film 307 substantially intact. The portion of the insulating layer 303 beneath the sacrificial plug 305 may also be removed. This may be done using, for example, well-known etching techniques. The resultant structure is shown in FIG. 3C.

A gate dielectric layer 313 and a gate dielectric barrier layer 315 are formed over the substrate 301 in the opening 309. The gate dielectric and barrier layers 313 and 315 may be formed from $TiO_2$ and TiN or $Ta_2O_5$ and TaN, respectively. This may be done using similar techniques as discussed above. For example, a tantalum or titanium layer may be deposited in the opening 309. The layer may then be oxidized and nitrided to form the gate dielectric layer 313 and barrier layer 315.

Figure 3D:
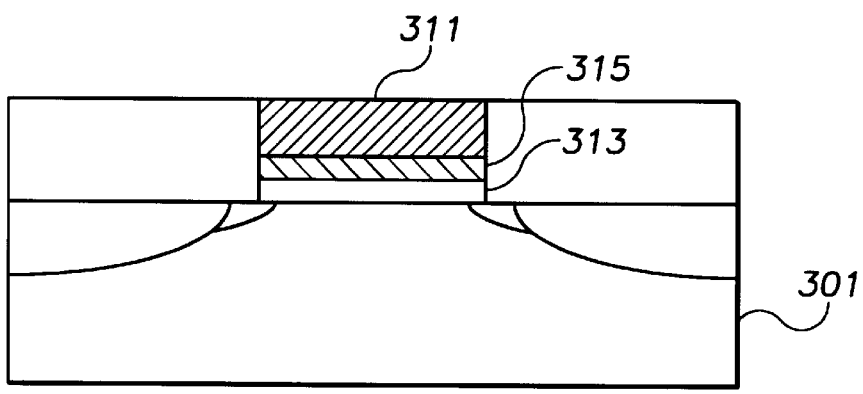
Figure 3E:
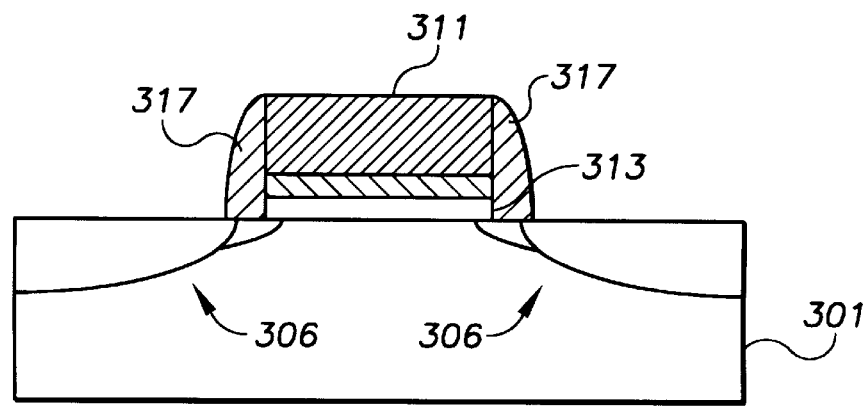

A metal gate electrode 311 is formed in the opening 309 over the barrier layer 315. The resultant structure is illustrated in FIG. 3D. The gate electrode 311 may be formed from any suitable metal, including in particular copper, using, e.g., well-known deposition techniques. The copper may, e.g., be deposited to a thickness greater than that of the film 307 and then planarized using, e.g., well-known chemical-mechanical polishing techniques. The film 307 may be removed to expose the active regions 306 of the substrate 301. Nitrogen-bearing spacers 317 may then be formed on sidewalls of the gate electrode 311. The spacers 317 will serve as a diffusion barrier for the metal of the gate electrode 311 and will also serve to seal the gate dielectric layer 313 against the substrate 301. While nitrogen-bearing spacers are illustrated, it should be appreciated that the need for such spacers is less in this case due to the formation of the source/drain regions prior to the gate electrode. Following formation of nitrogen bearing spacers, if any, fabrication of the semiconductor device may continue with well-known processing steps such as contact formation, and so forth to complete the device structure.

Using the above processes, gate electrodes formed from temperature-sensitive metals, such as copper, may be formed with TiN or TaN barrier layers. This provides the reliability and performance advantages discussed above and also allows for a wider variety of metals to be used.

The above processes are provided by way of example and not of limitation. A wide variety of alternative processing techniques may be used to form a metal gate electrode along with a titanium or tantalum nitride gate dielectric barrier layer. For instance, in any of the above processes, the gate dielectric layer and barrier layer may be formed separately. For example, a gate dielectric may be deposited over the substrate and a titanium or tantalum nitride barrier layer may then be deposited over the deposited gate dielectric layer. In this case, the gate dielectrics would not be limited to titanium or tantalum oxides, but could extend to any type of dielectric including, but not limited to, oxides such as silicon dioxide and higher permittivity oxides like barium strontium titanate. In another embodiment, a Ta/Ti layer may be completely oxidized to form a Ta/Ti-bearing gate oxide and a TaN/TiN barrier layer may then be deposited over the Ta/Ti-bearing gate oxide.

As noted above, the present invention is applicable to the fabrication of a number of different devices in which the benefits of a metal gate electrode and a TiN or TaN gate barrier layer are desirable. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A semiconductor fabrication process, comprising:
   forming a gate dielectric layer over a substrate;
   forming a titanium or tantalum nitride barrier layer over the gate dielectric layer;
   forming a metal gate electrode over the titanium or tantalum nitride barrier layer; and
   forming nitrogen bearing spacers adjacent sidewalls of the metal gate electrode.

2. The process of claim 1, wherein the barrier layer has a thickness which is sufficiently thick to inhibit interaction between the metal gate electrode and the gate dielectric layer.

3. The process of claim 2, wherein the barrier layer thickness ranges from about 50 to 200 Angstroms.

4. The process of claim 1, wherein the nitrogen bearing spacers and the barrier layer seal the gate dielectric against the substrate.

5. The process of claim 1, wherein forming the gate dielectric layer includes forming a metal oxide.

6. The process of claim 5, wherein forming the metal oxide and forming the titanium or tantalum nitride barrier layer includes depositing a layer of titanium or tantalum over the substrate and using the layer of titanium or tantalum to form one or both of the gate dielectric layer and the barrier layer.

7. The process of claim 6, wherein using the layer of titanium or tantalum to form one or both of the gate dielectric layer and the barrier layer includes oxidizing the layer of titanium or tantalum.

8. The process of claim 7, wherein using the layer of titanium or tantalum to form one or both of the gate dielectric layer and the barrier layer includes nitridizing the layer of titanium or tantalum.

9. The process of claim 1, further including forming source/drain regions after forming the metal gate electrode.

10. The process of claim 9, wherein the gate electrode is formed from tungsten.

11. The process of claim 1, further including forming source/drain regions before forming the metal gate electrode.

12. The process of claim 11, wherein the gate electrode is formed from copper.

13. A semiconductor fabrication process, comprising:
    forming a gate dielectric layer over a substrate;
    forming a titanium or tantalum nitride barrier layer over the gate dielectric layer;
    forming a tungsten gate electrode over the nitride barrier layer;
    forming nitrogen-bearing spacers adjacent sidewalls of the tungsten gate electrode, the nitrogen-bearing spacers and nitride barrier layer sealing the gate dielectric layer against the substrate;
    implanting dopant into regions of the substrate adjacent the gate electrode;
    heating the substrate to activate the dopant, wherein the nitride barrier layer prevents interaction between the gate oxide layer and the tungsten gate electrode.

14. The process of claim 13, wherein the gate dielectric layer is formed from a material having a permittivity greater than silicon nitride.

15. The process of claim 14, wherein the gate dielectric layer is formed from tantalum pentoxide or titanium dioxide.

16. The process of claim 13, wherein the gate dielectric layer is formed with a thickness having the capacitive equivalence of about 10 to 20 Angstroms of silicon dioxide.

17. A semiconductor fabrication process, comprising:
    forming a titanium or tantalum layer over a substrate;
    using the titanium or tantalum layer to form a titanium or tantalum gate oxide layer over the substrate and to form a titanium or tantalum nitride barrier layer over the titanium or tantalum gate oxide layer; and
    forming a metal gate electrode over the titanium or tantalum nitride barrier layer.

18. The process of claim 17, wherein using the titanium or tantalum layer to form the titanium or tantalum gate oxide layer over the substrate and to form the titanium or tantalum nitride barrier layer over the titanium or tantalum gate oxide layer includes oxidizing and nitriding the titanium or tantalum layer.

19. The process of claim 17, wherein using the titanium or tantalum layer to form the titanium or tantalum gate oxide layer over the substrate and to form the titanium or tantalum nitride barrier layer over the titanium or tantalum gate oxide layer includes annealing the titanium or tantalum layer in an ambient including one or more nitrogen bearing species.

20. The process of claim 19, wherein using the titanium or tantalum layer to form the titanium or tantalum gate oxide layer over the substrate and to form the titanium or tantalum nitride barrier layer over the titanium or tantalum gate oxide layer includes annealing the titanium or tantalum layer in an ambient including one or more oxygen bearing species.

* * * * *

UNITED STATES PATENT AND TRADEMARK OFFICE
CERTIFICATE OF CORRECTION

PATENT NO.    : 6,225,168 B1         Page 1 of 1
DATED         : May 1, 2001
INVENTOR(S)   : Gardner et al.

It is certified that error appears in the above-identified patent and that said Letters Patent is hereby corrected as shown below:

<u>Column 6,</u>
Line 43, "feature" should read -- features --.
Line 46, "207" should read -- 307 --.

Signed and Sealed this

Ninth Day of July, 2002

Attest:

Attesting Officer

JAMES E. ROGAN
*Director of the United States Patent and Trademark Office*